United States Patent [19]
Dejenfelt

[11] Patent Number: 5,847,993
[45] Date of Patent: Dec. 8, 1998

[54] NON-VOLATILE PROGRAMMABLE CMOS LOGIC CELL AND METHOD OF OPERATING SAME

[75] Inventor: Anders T. Dejenfelt, Milpitas, Calif.

[73] Assignee: Xilinx, Inc., San Jose, Calif.

[21] Appl. No.: 881,719

[22] Filed: Jun. 23, 1997

[51] Int. Cl.$^6$ ................................................. G11C 16/04
[52] U.S. Cl. ................................. 365/185.1; 365/185.05
[58] Field of Search ........................... 365/185.05, 185.1, 365/185.01, 185.03; 326/38, 44, 45

[56] References Cited

U.S. PATENT DOCUMENTS

| | | | |
|---|---|---|---|
| 4,829,203 | 5/1989 | Ashmore | 365/185.1 |
| 5,005,155 | 4/1991 | Radjy | 365/185.1 X |
| 5,016,217 | 5/1991 | Brahmbhatt | 365/185.1 |
| 5,272,368 | 12/1993 | Turner et al. | 257/315 |
| 5,357,466 | 10/1994 | Hong | 356/185.1 X |
| 5,515,320 | 5/1996 | Miwa | 365/185.1 |
| 5,521,858 | 5/1996 | Shibata | 365/185.03 |
| 5,581,501 | 12/1996 | Sansbury et al. | 365/185.01 |
| 5,633,518 | 5/1997 | Broze | 365/185.1 X |

*Primary Examiner*—Son Mai
*Attorney, Agent, or Firm*—E. Eric Hoffman; Jeanette S. Harms

[57] ABSTRACT

A programmable logic cell which includes a first transistor having a first conductivity type, and a second transistor having a second conductivity type, opposite the first conductivity type. The first transistor is coupled in series between a first voltage supply terminal and an output terminal, while the second transistor is coupled in series between a second voltage supply terminal and the output terminal. The first and second transistors share a common floating gate and a common control gate, which extends over the common floating gate. The floating gate has substantially the same layout as the control gate. When the floating gate is programmed to store charge of a first polarity, the programmable logic cell enters a non-volatile first state and provides an output signal having a first logic state. When the floating gate is programmed to store charge of a second polarity, the programmable logic cell enters a non-volatile second state and provides an output signal having a second logic state. When the floating gate is programmed to store a neutral charge, the programmable logic cell enters a third state in which the programmable logic cell provides an output signal representative of a predetermined logic function in response to one or more input signals. This logic function can be, for example, an inverter function, a logical NAND function, or a logical NOR function. The output terminal of the programmable logic cell can be coupled to a pass transistor of a programmable interconnect structure or to a configurable logic block of a field programmable gate array.

20 Claims, 6 Drawing Sheets

NON-VOLATILE PROGRAMMABLE CMOS LOGIC CELL AND METHOD OF OPERATING SAME

BACKGROUND OF THE INVENTION

1. Field of the Invention

This invention relates to non-volatile programmable CMOS logic technology and in particular to a structure and method for implementing a floating gate in a logic device to add to the logic device the function of a non-volatile memory cell.

2. Discussion of Related Art

FIG. 1 is a block diagram of a conventional programmable logic device (PLD). In general, a PLD is a logic circuit which can be configured to perform various logic functions. The configuration of the PLD is determined by the programmed state of one or more configuration memory cells. Thus, PLD 101 includes SRAM configuration memory cell 102 and logic gate array 103. The logic function of logic gate array 103 is programmed by setting the state of SRAM configuration memory cell 102 (and a plurality of similar configuration memory cells which are not shown). Prior to the initial configuration of PLD 101, non-volatile memory 104 initially stores the configuration data, which is subsequently loaded into configuration memory cell 102 (as well as the other configuration memory cells).

Because SRAM configuration memory cell 102 is a volatile memory cell, the configuration data must be loaded into configuration memory cell 102 from non-volatile memory 104 after each power up. This can be a time consuming process. Non-volatile memory 104 is typically located separate from PLD 101, and is only coupled to PLD 101 during the configuration of PLD 101. Non-volatile memory can be, for example, a semiconductor memory or a magnetic memory disk. To configure PLD 101, the configuration data is transmitted from non-volatile memory 104 to PLD 101 on a dedicated bus. The configuration data is readily accessible on this dedicated bus during configuration of PLD 101. Thus, a copyist who wishes to copy the configuration of the programmed PLD 101 need only monitor the dedicated bus. It would therefore be desirable to have a programmable logic device which does not need to be re-configured each time the programmable logic device is powered up.

FIG. 2 is a block diagram of a conventional configuration memory cell 201 which includes two EPROM memory cells 202 and 203 having the same conductivity type. One such configuration memory cell is disclosed in U.S. Pat. No. 5,581,501 to Sansbury et al. EPROM memory cells 202 and 203 have dedicated floating gates 204 and 205, respectively. EPROM memory cells 202 and 203 are each initialized to a logic low (conducting) state. One of EPROM memory cells 202 or 203 is subsequently programmed to a logic high (non-conducting) state, while the other one of EPROM memory cells 202 or 203 remains in a logic low state, thereby determining the programmed state of memory cell 201. Each EPROM memory cell 202 or 203 requires a dedicated floating gate 204 and 205, thereby causing the layout area of memory cell 201 to be relatively large. In addition, memory cell 201 is strictly a memory cell, and not a logic element which dynamically provides an output signal in response to an input signal.

FIG. 3 is a block diagram of another conventional programmable memory cell 301 which includes p-channel transistor 302, n-channel transistor 303, tunnel capacitor 304 and control capacitor 305. One such memory cell is disclosed in U.S. Pat. No. 5,272,368 to Turner et al. Transistors 302 and 303 are coupled between voltage supply terminals 306 and 307 as illustrated. A floating gate 308 is located over the channel regions of transistors 302 and 303. Floating gate 308 extends outside of the active regions of transistors 302 and 303 to form the upper plate of control capacitor 305, as well as the upper plate of tunnel capacitor 304. Doped regions of the underlying substrate (which are separated from the floating gate 308 by an oxide layer) form the lower plate of control capacitor 305 and the lower plate of tunnel capacitor 304. Data values are programmed, erased, read and verified within memory cell 301 in response to voltages applied to control capacitor 305 and tunnel capacitor 304. However, because both control capacitor 305 and tunnel capacitor 304 are located outside of the active regions of transistors 302 and 303, the layout area of memory cell 301 is relatively large. Moreover, memory cell 301 is strictly a memory cell, and not a logic element which dynamically provides an output signal in response to an input signal.

It would therefore be desirable to have a non-volatile memory cell, having a minimal layout area, which is programmable to configure a PLD and which is also capable of dynamically operating as a logic element.

SUMMARY

Accordingly, the present invention provides a programmable logic cell which includes a first transistor having a first conductivity type, and a second transistor having a second conductivity type, opposite the first conductivity type. A field insulating layer exists between the first and second transistors. The first transistor is coupled in series between a first voltage supply terminal and an output terminal, while the second transistor is coupled in series between a second voltage supply terminal and the output terminal. The first and second transistors share a common floating gate and a common control gate. The control gate extends over the floating gate, and has substantially the same layout as the floating gate, thereby forming a stacked gate structure. A substantial portion of the stacked gate structure is located over the field insulating layer. Because the field insulating layer is needed for isolation purposes between the complementary first and second transistors, the portion of the stacked gate structure located over the field insulating layer does not consume any additional layout area. As a result, the programmable logic cell has a relatively small layout area.

When the floating gate is programmed to store charge of a first polarity, the programmable logic cell enters a non-volatile first state and provides an output signal having a first logic state. When the floating gate is programmed to store charge of a second polarity, the programmable logic cell enters a non-volatile second state and provides an output signal having a second logic state. As a result, the programmable logic cell advantageously operates as a non-volatile memory cell by programming the floating gate with the appropriate charge.

When the floating gate is programmed to store a neutral charge, the programmable logic cell enters a third state in which the programmable logic cell provides an output signal representative of a predetermined logic function in response to one or more input signals. Depending on the configuration of the programmable logic cell, the logic function implemented can be, for example, an inverter function, a logical NAND function, or a logical NOR function.

The programmable logic cell therefore advantageously operates as either a non-volatile memory cell or implements a predetermined logic function, depending on the programmed state of the floating gate. The output terminal of the programmable logic cell can be coupled to a pass transistor of a programmable interconnect structure or to a configurable logic block of a field programmable gate array.

This invention will be more fully understood in connection with the following detailed description taken together with the drawings.

DETAILED DESCRIPTION

Figure 4:
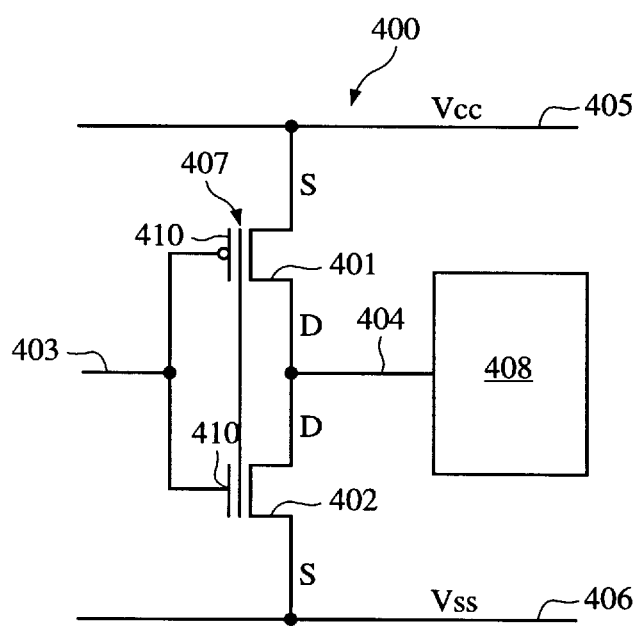
FIG. 4 is a schematic diagram of a programmable logic cell which can be operated as a non-volatile memory cell or an inverter in accordance with one embodiment of the invention.

FIG. 4 is a schematic diagram of a programmable logic cell (PLC) 400 which is programmable to operate as a non-volatile memory cell or an inverter in accordance with one embodiment of the invention. PLC 400 consists of p-channel floating gate transistor 401, n-channel floating gate transistor 402, input terminal 403, output terminal 404, $V_{CC}$ voltage supply terminal 405, and $V_{SS}$ voltage supply terminal 406. Transistors 401 and 402 share a common floating gate 407 and a common control gate 410.

The source of transistor 401 is connected to $V_{CC}$ voltage supply terminal 405. The source of transistor 402 is connected to $V_{SS}$ voltage supply terminal 406. The drains of transistors 401 and 402 are connected to output terminal 404. Output terminal 404 is further connected to logic circuit 408, which is typically fabricated on the same substrate as PLC 400. The input terminal 403 is connected to the common control gate 410. Floating gate 407 is positioned under control gate 410 and over the channel regions of transistors 401 and 402. The layout of PLC 400 is described in more detail below in connection with FIGS. 5–7.

In one embodiment, $V_{CC}$ voltage supply terminal 405 is maintained at a voltage of 5 volts, and $V_{SS}$ voltage supply terminal 406 is maintained at a voltage of 0 volts (ground) during normal operation of PLC 400. However, $V_{CC}$ and $V_{SS}$ voltage supply terminals 405 and 406 can be maintained at other voltages in other embodiments of the invention. For example, $V_{CC}$ voltage supply terminal 405 can be maintained at 3.3 volts or 2.5 volts, while $V_{SS}$ voltage supply terminal 406 is maintained at 0 volts. PLC 400 can act as a non-volatile memory cell or as an inverter, depending on the programmed state of PLC 400. The programmed state of PLC 400 is determined by the amount and polarity of the charge stored in floating gate 407.

When there is no charge stored in floating gate 407, PLC 400 acts as an inverter. In this state, the effective gate voltage of transistors 401 and 402 will be a fraction of the voltage applied to input terminal 403. This fraction is hereinafter referred to as the coupling factor ($C_F$). The value of the coupling factor $C_F$ depends on the specific structure and implementation of the logic cell, but is typically in the range of 0.7 to 0.9. The upper limit is set by the cell size (i.e., the area of floating gate 407 and control gate 410). For example, if transistors 401 and 402 exhibit a coupling factor $C_F$ 0.8, then the application of a five volt input signal on control gate 410 will result in an effective applied gate voltage of 4 volts to transistors 401 and 402.

When there is no charge stored in floating gate 407, and a logic high voltage is applied to control gate 410, n-channel transistor 402 is turned on, thereby coupling output terminal 404 to $V_{SS}$ voltage supply terminal 406. P-channel floating gate transistor 401 is turned off, thereby isolating output terminal 404 from $V_{CC}$ voltage supply terminal 405. As a result, a logic low voltage $V_L$ is applied to logic circuit 408. This logic low voltage $V_L$ has a value which is equal to $V_{SS}$. Logic circuit 408 is designed to interpret the voltage $V_L$ as a logic low voltage.

When there is no charge stored in floating gate 407, and a logic low voltage is applied to control gate 410, p-channel transistor 401 is turned on, thereby coupling output terminal 404 to $V_{CC}$ voltage supply terminal 405. N-channel transistor 402 is turned off, thereby isolating output terminal 404 from $V_{SS}$ voltage supply terminal 406. As a result, a logic high voltage $V_H$ is applied to logic circuit 408. This logic high voltage $V_H$ has a value which is equal to $V_{CC}$. Logic circuit 408 is designed to interpret the voltage $V_H$ as a logic high voltage.

By storing a charge in floating gate 407, PLC 400 can be operated as a non-volatile memory cell. When there is considerable charge stored in floating gate 407, the threshold voltages of transistors 401 and 402 can be adjusted by an offset voltage which is approximately equal to the charge stored in floating gate 407 divided by the total capacitance of floating gate 407. The threshold voltage of transistor 401 (or transistor 402) is defined as the effective voltage which must be applied to the control gate 410 in order to turn on transistor 401 (or transistor 402).

When a negative charge is stored in floating gate 407, the threshold voltage of n-channel transistor 402 increases. This is because the negative charge stored in floating gate 407 tends to repel negative charge carriers from the channel region of n-channel transistor 402.

Similarly, a negative charge stored in floating gate 407 causes the threshold voltage of p-channel transistor 401 to decrease. This is because the negative charge stored in floating gate 407 tends to attract positive charge carriers to the channel region of the p-channel transistor 401.

If the amount of negative charge stored in floating gate 407 is large enough, the threshold voltages of transistors 401 and 402 will be offset by amounts sufficient to ensure that p-channel transistor 401 will be turned on and n-channel transistor 402 will be turned off for any voltage applied to input terminal 403 within the range of $V_{SS}$ to $V_{CC}$. As a result, PLC 400 will continuously provide a logic high voltage at output terminal 404. This state of PLC 400 is non-volatile, because the negative charge will remain stored in floating gate 407 even after power is removed from $V_{CC}$ and $V_{SS}$ voltage supply terminals 405 and 406.

Conversely, when a positive charge is stored in floating gate 407, the threshold voltage of n-channel transistor 402 decreases, and the threshold voltage of p-channel transistor 401 increases. As a result, a voltage which is less than $V_{CC}$ can be applied to control gate 410 to turn on n-channel transistor 402. That is, it is easier to turn on n-channel transistor 402. Moreover, a voltage which is less than $V_{SS}$ must be applied to control gate 410 to turn on p-channel transistor 401. That is, it is harder to turn on p-channel transistor 401.

If the amount of positive charge stored in floating gate 407 is large enough, the threshold voltages of transistors 401 and 402 will be offset by amounts sufficient to ensure that n-channel transistor 402 will be turned on and p-channel transistor 401 will be turned off for any voltage applied to input terminal 403 within the range of $V_{SS}$ to $V_{CC}$. As a result, PLC 400 will continuously provide a logic low voltage at output terminal 404. This state of PLC 400 is non-volatile, because the positive charge will remain stored in floating gate 407 even after power is removed from $V_{CC}$ and $V_{SS}$ voltage supply terminals 405 and 406. In the foregoing manner, PLC 400 can be operated as a non-volatile memory cell. Table 1 is a truth table of PLC 400.

TABLE 1

| Signal at Input 403 | Floating Gate 407 Charge State | Signal at Output 408 |
|---|---|---|
| High | 0 | Low |
| Low | 0 | High |
| High | Negative | High |
| Low | Negative | High |
| High | Positive | Low |
| Low | Positive | Low |

Programmable logic cell 400 can be used as a configuration memory cell which stores a configuration bit in a field programmable gate array (FPGA) or a programmable logic device (PLD). In general, output terminal 404 of PLC 400 is connected to a control point of the FPGA (not shown). This control point can be, for example, the gate electrode of a pass transistor. The state of PLC 400 determines whether the pass transistor is turned on, thereby completing a programmable connection between two different elements of the FPGA, or turned off, thereby isolating two different elements of the FPGA. Alternatively, the control point can provide an input signal to a configurable logic block (CLB) of the FPGA. The programmed state of PLC 400 is selected in view of the intended signal to be provided to the CLB.

In an alternative embodiment, input terminal 403 is connected to $V_{CC}$ voltage supply terminal 405. When floating gate 407 is in a neutral or positive charge state, the signal provided at output terminal 404 has a logic low value. When floating gate 407 is in a negative charge state, the signal provided at output terminal 404 will change to a logic high value (assuming that the negative charge stored in floating gate 407 is sufficient to offset the threshold voltages $V_{TN}$ and $V_{TP}$ by an amount greater than $V_{CC}-V_{SS}$). In this state, n-channel transistor 402 will be turned off and p-channel transistor 401 will be turned on, even when a logic high voltage (i.e., $V_{CC}$) is applied to the input terminal 405. In this embodiment, PLC 400 operates as a non-volatile programmable storage cell, the output of which is controlled by the charge state of the floating gate 407.

In one variation of this embodiment, the charge state of floating gate 407 is selected to be either negative or neutral. These are the same two charge states normally stored in the floating gates of memory cells which implement conventional non-volatile FLASH and EEPROM memory technology. In this variation, the positive charge state of the floating gate in PLC 400 is not utilized. Limiting the possible charge states to two simplifies the programming and erasing of the PLC 400 by reducing the voltage requirements to the voltage requirements commonly used in conventional non-volatile memory technology.

Figure 5:
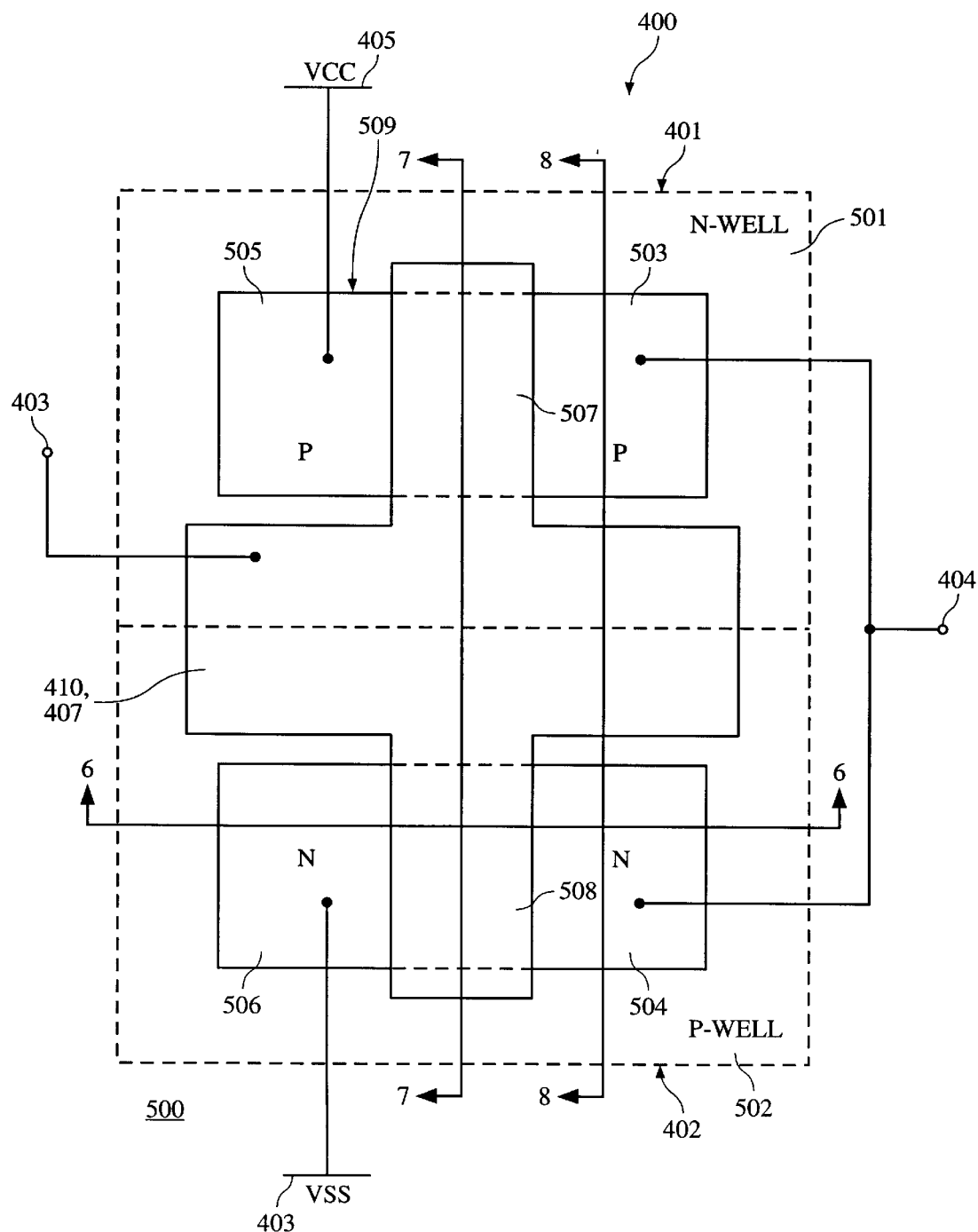
FIG. 5 is a top view of the layout of the programmable logic cell of FIG. 4 in accordance with one embodiment of the invention.
Figure 6:
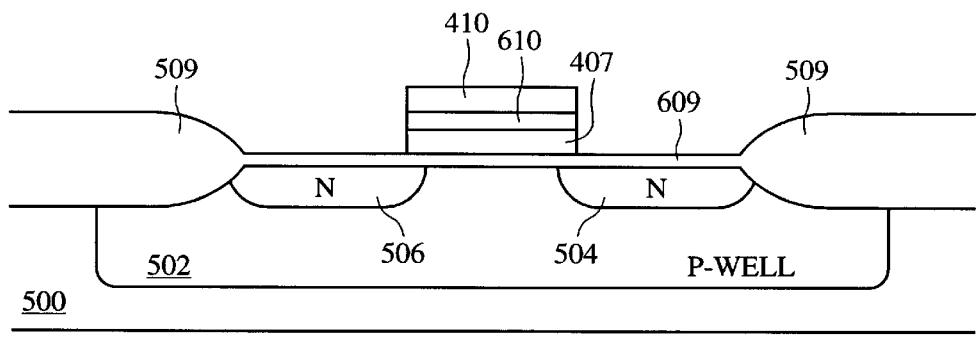
FIG. 6 is a cross sectional view of the programmable logic cell of FIG. 5 along section line 6—6.
Figure 7:
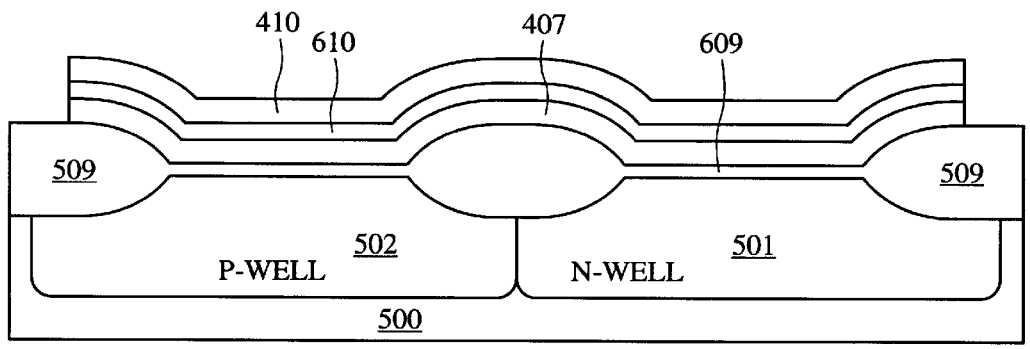
FIG. 7 is a cross sectional view of the programmable logic cell of FIG. 5 along section line 7—7.
Figure 8:
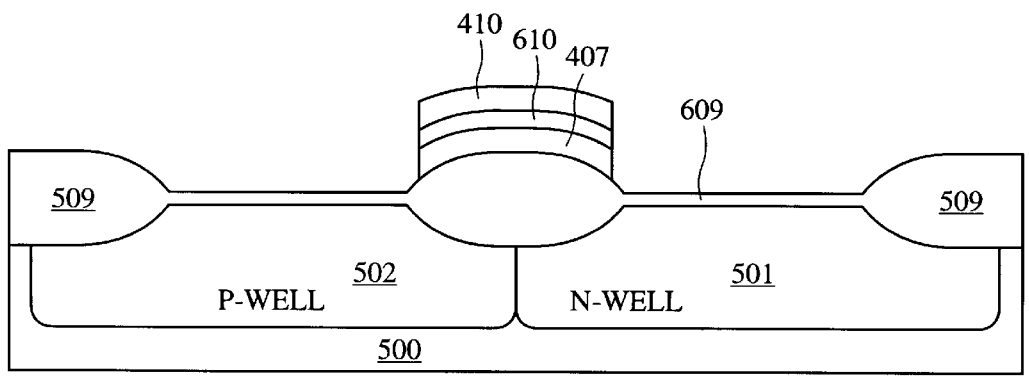
FIG. 8 is a cross sectional view of the programmable logic cell of FIG. 5 along section line 8—8.

FIG. 5 is a top view of the layout of PLC 400 in accordance with one embodiment of the present invention. FIG. 6 is a cross sectional view of PLC 400 along section line 6—6 of FIG. 5. FIG. 7 is a cross sectional view of PLC 400 along section line 7—7 of FIG. 5. FIG. 8 is a cross sectional view of PLC 400 along section line 8—8 of FIG. 5. PLC 400 is fabricated on a substrate 500. In the described embodiment, substrate 500 is monocrystalline silicon. N-well region 501 and p-well region 502 are formed adjacent to one another in substrate 500. Well regions 501 and 502 are formed by conventional methods, such as diffusion or ion implantation.

Field insulating layer 509 and gate dielectric layer 609 (FIGS. 6 and 7), which are typically formed from thermally grown silicon oxide, are formed over substrate 500. Floating gate 407 is formed over gate dielectric layer 609 using conventional processing steps. The shape of floating gate 407 is selected to maximize the area (i.e., capacitance) of floating gate 407. To accomplish this, a portion of floating gate 407 is located over the field insulating layer 509 between transistors 401 and 402. Because field insulating layer 509 is needed for isolation purposes between complementary transistors 401 and 402, the portion of floating gate 407 which is located over field insulating layer 509 does not consume any additional layout area. As a result, PLC 400 has a relatively small layout area.

Floating gate 407 is formed of a material capable of storing charge, such as polysilicon. Another dielectric layer 610 (FIGS. 6 and 7) is formed over floating gate 407. Electrically conductive control gate 410, is formed over dielectric layer 610, thereby resulting in a stacked gate structure. Control gate 410 can be, for example, conductively doped polysilicon, metal or a metal silicide. As illustrated in FIGS. 5–8, control gate 410 and floating gate 407 have substantially the same layout pattern. Since FIG. 5 is a top view, control gate 410 and floating gate 407 appear to be the same element in FIG. 5. However, as seen from FIGS. 6–8, they are separate, vertically stacked elements.

P-type source region 505, p-type drain region 503, n-type source region 506 and n-type drain region 504 are fabricated in substrate 500 as illustrated using, for example, conventional ion implantation steps. Source regions 505 and 506 and drain regions 503 and 504 are self aligned with floating gate 407, control gate 410 and field oxide layer 509. Source region 505 and drain region 503 define a channel region 507 of p-channel transistor 401. Similarly, source region 506 and drain region 504 define a channel region 508 of n-channel transistor 402.

Because PLC 400 utilizes a floating gate 407 which is shared by two transistors 401 and 402, and because PLC 400 utilizes a floating gate 407 and a control gate 410 having a stacked configuration, PLC 400 advantageously requires a minimal layout area.

The programming and erasing of PLC 400 will be described with reference to FIGS. 4–8. PLC 400 can be programmed using one of two physical mechanisms; Fowler-Nordheim tunneling or hot-electron injection. Each of these programming mechanisms will be described separately with reference to FIGS. 4–8.

Fowler-Nordheim tunneling

For Fowler-Nordheim tunneling, gate dielectric layer 609 is fabricated as a thin tunnel-oxide having a thickness of approximately 80–100 Å. If a high electric field on the order of 10 MV/cm is applied across this tunnel-oxide 609, electrons will tunnel through this oxide 609 by a physical mechanism known as Fowler-Nordheim (F-N) Tunneling. F-N tunneling is known to those of ordinary skill in the art.

In order to store a negative charge in floating gate 407, the programming conditions set forth below in Table 2 may be applied.

TABLE 2

F-N Programming and Erasing of PLC 400

|  | $V_{SS}$ Terminal 406 (Source of 402) | Output Line 404 (Drain of 402, 403) | $V_{CC}$ Terminal 405 (Source of 401) | Control Gate 410 |
|---|---|---|---|---|
| Programming | 0 V | 0 V or floating | 0–5 V | 15 V |
| Erase | 12 V | 0 V or floating | 0–5 V | 0 V |
| Erase (Negative Gate) | 5 V | 0 V or floating | 0–5 V | –10 V |

During programming, electrons will tunnel from the n-channel source junction 506 and the inversion charge channel region 508 of n-channel transistor 402, into floating gate 407. The programming time will depend on the specific thickness of tunnel-oxide 609, as well as the coupling factor $C_F$. P-channel transistor 401 will be turned off during the programming operation, so no DC current will flow. A positive voltage applied to $V_{CC}$ voltage supply terminal 405 during the programming operation will capacitively couple into floating gate 407, thereby increasing the voltage of floating gate 407 and increasing the programming efficiency.

In order to erase PLC 400 and return the charge on the floating gate to a neutral state, the erase bias conditions set forth in Table 2 can be applied.

A positive voltage applied to $V_{CC}$ voltage supply terminal 405 will capacitively couple into floating gate 407, thereby increasing the floating gate voltage and decreasing the erasing efficiency. $V_{CC}$ voltage supply terminal 405 is therefore be switched from 5 V to 0 V during erasing in order to obtain the most effective erasing conditions. This switching is performed by circuitry which is easily designed by one of ordinary skill in the art.

In a process technology where negative voltages can be generated from internal charge-pump circuitry, an alternative erasing condition can be applied also shown in Table 2 (i.e., Erase (Negative Gate)). The negative erase voltage is applied to control gate 410. Again, a voltage of 0 V is preferred on $V_{CC}$ voltage supply terminal 405 to improve erasing speed.

To program floating gate 407 with a positive charge, one of the previously described erasing procedures is used to draw electrons out of floating gate 407 until floating gate 407 exhibits a positive charge.

Hot-Electron Injection

PLC 400 can also be programmed and erased using hot-electron injection. Hot-electron injection is performed by generating a high electric field at the drain end of an n-channel transistor (e.g., n-channel transistor 402). A fraction of the channel electrons gain sufficient energy to overcome the energy barrier between the silicon channel 508 and the $SiO_2$ gate dielectric layer 609. With the simultaneous application of a high positive bias voltage to control gate 410, the energetic electrons in the channel region are injected into gate dielectric layer 609, and subsequently transferred to floating gate 407. This mechanism is well known to those of ordinary skill in the art. The application of this method is more restricted, since the gate, source and drain terminals need to be accessed for efficient programming. Thus, the hot-electron injection method lends itself readily to PLC 400. However, more complex programmable logic cells (e.g., PLCs 800 and 900) are not directly suited for this programming method because the internal source and drain regions of the n-channel transistors are not readily accessible.

In order to negatively charge floating gate 407, the programming conditions set forth in Table 3 may be applied.

TABLE 3

Hot-Electron Programming of PLC 400

|  | $V_{SS}$ Terminal 406 (Source of 402) | Output Terminal 404 (Drain of 402) | $V_{CC}$ Terminal 405 (Source of 401) | Control Gate 410 |
|---|---|---|---|---|
| Programming | 0 V | 5 V | 5 V | 10–12 V |

P-channel transistor 401 will be turned off during the hot-electron programming of PLC 400. PLC 400 is erased in accordance with the F-N tunneling techniques previously described in connection with Table 2.

Figure 9:
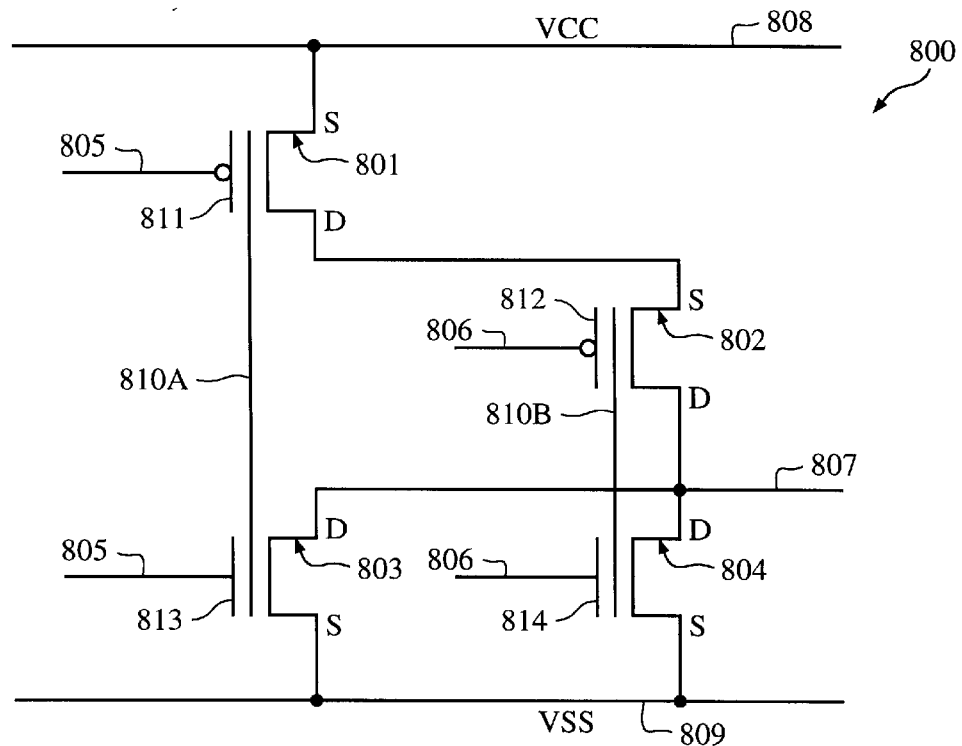
FIG. 9 is a schematic diagram of a programmable logic cell which can be operated as a non-volatile memory cell or an NOR gate in accordance with another embodiment of the present invention.

The above described programmable logic cell 400 can be operated as either an inverter (driver) or a non-volatile memory cell. However, in other embodiments, the programmable logic cell can be configured to implement other logic functions (other than an inverter). Like PLC 400, the PLCs in accordance with these embodiments can also be programmed to operate as a non-volatile memory cell. For example, FIG. 9 is a schematic diagram of a programmable logic cell 800 which operates as a NOR gate or a non-volatile memory cell, depending on the charge stored in common floating gates 810a and 810b.

PLC 800 includes p-channel floating gate transistors 801 and 802, n-channel floating gate transistors 803 and 804, first input terminal 805, second input terminal 806, output terminal 807, $V_{CC}$ voltage supply terminal 808 and $V_{SS}$ voltage supply terminal 809. The control gate 811 of p-channel transistor 801 is coupled to input terminal 805, the source of p-channel transistor 801 is coupled to $V_{CC}$ voltage supply terminal 808, and the drain of p-channel transistor 801 is coupled to the source of p-channel transistor 802. The control gate 812 of p-channel transistor 802 is coupled to input terminal 806, and the drain of p-channel transistor 802 is coupled to output terminal 807 as well as the drains of n-channel transistors 803 and 804. The sources of n-channel transistors 803 and 804 are coupled to $V_{SS}$ voltage supply terminal 809. The control gate 813 of n-channel transistor 803 is coupled to input terminal 805. The control gate 814 of n-channel transistor 804 is coupled to input terminal 806. Transistors 801 and 803 share a common floating gate 810a, while transistors 802 and 804 share another common floating gate 810b. Floating gate 810a extends over the channel regions of transistors 801 and 803. Similarly, floating gate 810b extends over the channel regions of transistors 802 and 804. Control gates 811 and 813 extend over floating gate 810a. Control gates 812 and 814 extend over floating gate 810b.

If floating gates 810a and 810b both store a neutral charge and either of input terminals 805 or 806 receives a logic high voltage signal, at least one of p-channel transistors 801 and 802 will be turned off. As a result, output terminal 807 is isolated from $V_{CC}$ voltage supply terminal 808. Furthermore, at least one of n-channel transistors 803 and 804 will be turned on, thereby coupling output terminal 807 to $V_{SS}$ voltage supply terminal 809. A logic low output signal (i.e., $V_{SS}$) is therefore provided to output terminal 807 when either one (or both) of the input signals has logic high voltage level.

If logic low voltages are applied to both of input terminals 805 and 806, both n-channel transistors 803 and 804 are turned off, thereby isolating output terminal 807 from $V_{SS}$ voltage supply terminal 809. Furthermore, both p-channel transistors 801 and 802 are turned on, thereby coupling output terminal 807 to $V_{CC}$ voltage supply terminal 808. A logic high output signal (i.e., $V_{CC}$) is therefore provided to output terminal 807 when both of the input signals have logic low voltage levels.

In the foregoing manner, PLC 800 implements a logical NOR function in accordance with known theory of CMOS logic gate construction when the floating gates 810a and 810b both store a neutral charge.

If floating gates 810a and 810b are programmed to store a negative charge, n-channel transistors 803 and 804 will be turned off, and p-channel transistors 801 and 802 will be turned on for any voltages applied to input terminals 805 and 806 (within a range of $V_{CC}$ to $V_{SS}$). As a result, a logic high voltage (i.e., $V_{CC}$) is provided to output terminal 807. Furthermore, if floating gates 810a and 810b are programmed to store a positive charge, n-channel transistors 803 and 804 will be turned on and p-channel transistors 801 and 802 will be turned off for any voltages applied to input terminals 805 and 806 (within a range $V_{CC}$ to $V_{SS}$) As a result, a logic low voltage (i.e., $V_{SS}$) is provided to output terminal 807. In this manner, PLC 800 can be programmed to operate as a non-volatile memory cell.

The logic functionality of PLC 800 is set forth below in Table 4.

TABLE 4

PLC 800 Truth Table

| Input Terminal 805 | Input Terminal 806 | Floating Gate 810a charge state | Floating Gate 810b Charge state | Output Terminal 807 |
|---|---|---|---|---|
| High | High | 0 | 0 | Low |
| Low | High | 0 | 0 | Low |
| High | Low | 0 | 0 | Low |
| Low | Low | 0 | 0 | High |
| High | High | Neg. | 0 | Low |
| Low | High | Neg. | 0 | Low |
| High | Low | Neg. | 0 | High |
| Low | Low | Neg. | 0 | High |
| High | High | 0 | Neg. | Low |
| Low | High | 0 | Neg. | High |
| High | Low | 0 | Neg. | Low |
| Low | Low | 0 | Neg. | High |
| High | High | Neg. | Neg. | High |
| Low | High | Neg. | Neg. | High |
| High | Low | Neg. | Neg. | High |
| Low | Low | Neg. | Neg. | High |
| High | High | Pos. | 0 | Low |
| Low | High | Pos. | 0 | Low |
| High | Low | Pos. | 0 | Low |
| Low | Low | Pos. | 0 | Low |
| High | High | 0 | Pos. | Low |
| Low | High | 0 | Pos. | Low |
| High | Low | 0 | Pos. | Low |
| Low | Low | 0 | Pos. | Low |
| High | High | Pos. | Pos. | Low |
| Low | High | Pos. | Pos. | Low |
| High | Low | Pos. | Pos. | Low |
| Low | Low | Pos. | Pos. | Low |

The programming and erasing methods previously described in connection with PLC 400 can be applied to program and erase PLC 800 in the manner set forth in Table 5.

TABLE 5

F-N Programming and Erasing of PLC 800

| | $V_{SS}$ Terminal 809 (Source of 803) | Output Terminal 807 (Drains of 803, 804) | $V_{CC}$ Terminal 808 (Source of 801) | Control Gate 805 | Control Gate 806 |
|---|---|---|---|---|---|
| Programming Float. Gate 810A | 0 V | 0 V or floating | 0–5 V | 15 V | 0 V |
| Programming Float. Gate 810B | 0 V | 0 V or floating | 0–5 V | 0 V | 15 V |
| Erase both Float. Gate 810A, 810B | 12 V | 0 V or floating | 0–5 V | 0 V | 0 V |
| Erase Float. Gate 810A (Negative Gate) | 5 V | 0 V or floating | 0–5 V | –10 V | 0–5 V |
| Erase Float. Gate 810B (Negative Gate) | 5 V | 0 V or floating | 0–5 V | 0–5 V | –10 V |

F-N tunneling occurs in n-channel transistors 803 and 804 between the respective floating gates 810a and 810b, and the source junctions of transistors 803 and 804, which are connected to $V_{SS}$ voltage supply terminal 809. Since both transistors 803 and 804 are connected to $V_{SS}$ voltage supply terminal 809, applying 12V on $V_{SS}$ voltage supply terminal 809 will erase both floating gates 810a and 810b. Subsequent programming can then be performed to provide the desired programmed state on one or both of the floating gates 810a, 810b. When one of floating gates 810a and 810b is erased by applying a negative gate voltage, the floating gate which is not being erased is subjected to a disturb slow erase condition, due to the 5V applied to $V_{SS}$ voltage supply terminal 809. This disturb slow erase condition may be significantly reduced by applying 5V to the control gate associated with the floating gate which is not being erased.

Figure 10:
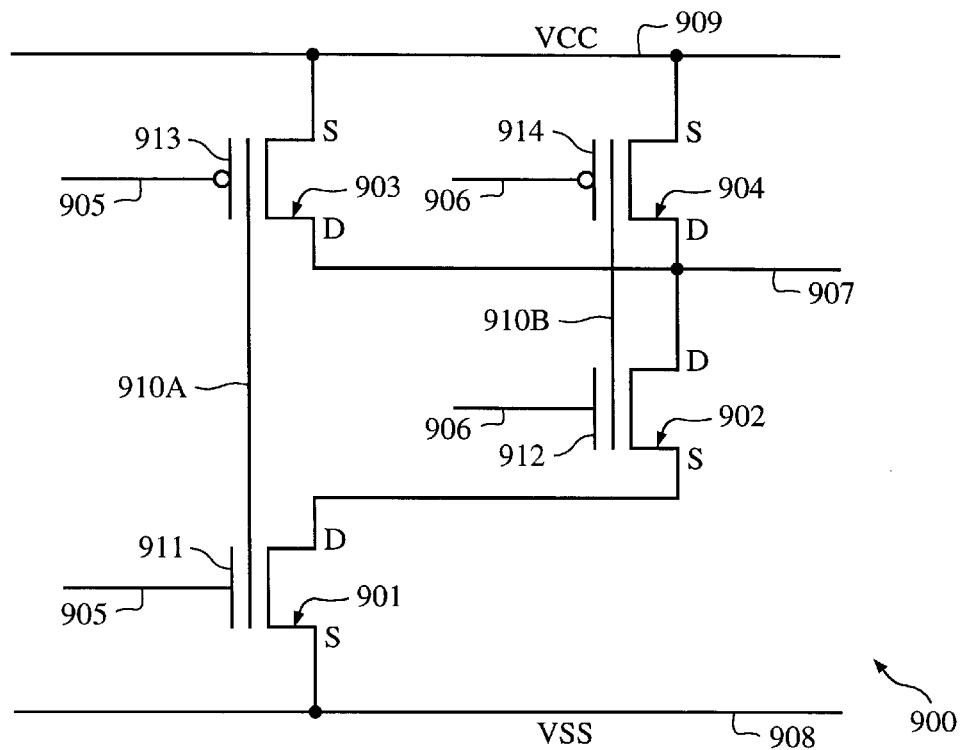
FIG. 10 is a schematic diagram of a programmable logic cell which can be operated as a non-volatile memory cell or an NAND gate in accordance with another embodiment of the present invention.

FIG. 10 is a schematic diagram of a programmable logic cell 900 which operates as a NAND gate or a non-volatile memory cell, depending on the charge stored in common floating gates 910a and 910b.

PLC 900 includes p-channel floating gate transistors 903 and 904, n-channel floating gate transistors 901 and 902, first input terminal 905, second input terminal 906, output terminal 907, $V_{CC}$ voltage supply terminal 909 and $V_{SS}$ voltage supply terminal 908. The control gate 913 of p-channel transistor 903 is coupled to input terminal 905, the source of p-channel transistor 903 is coupled to $V_{CC}$ voltage supply terminal 909, and the drain of p-channel transistor 903 is coupled to output terminal 907. The control gate 914 of p-channel transistor 904 is coupled to input terminal 906, the source of p-channel transistor 904 is coupled to $V_{CC}$ voltage supply terminal 909, and the drain of p-channel transistor 904 is coupled to output terminal 907. The control gate 911 of n-channel transistor 901 is coupled to input terminal 905, the source of n-channel transistor 901 is coupled to $V_{SS}$ voltage supply terminal 908 and the drain of n-channel transistor 901 is coupled to the source of n-channel transistor 902. The control gate 912 of n-channel transistor 902 is coupled to input terminal 906, and the drain of n-channel transistor 902 is coupled to output terminal 907 as well as the drains of p-channel transistors 903 and 904. Transistors 901 and 903 share a common floating gate 910a, while transistors 902 and 904 share another common floating gate 910b. Floating gate 910a extends over the channel regions of transistors 901 and 903. Similarly, floating gate 910b extends over the channel regions of transistors 902 and 904. Control gates 911 and 913 extend over floating gate 910a. Control gates 912 and 914 extend over floating gate 910b.

If floating gates 910a and 910b both store a neutral charge and either of input terminals 905 or 906 receives a logic low voltage signal, at least one of p-channel transistors 903 and 904 will be turned on. As a result, output terminal 907 is coupled to the $V_{CC}$ voltage supply terminal 909. Furthermore, at least one of n-channel transistors 803 and 804 will be turned off, thereby isolating output terminal 907 from $V_{SS}$ voltage supply terminal 908. A logic high output signal (i.e., $V_{CC}$) is therefore provided to output terminal 907 when either one (or both) of the input signals has logic low voltage level.

If logic high voltages are applied to both of input terminals 905 and 906, both n-channel transistors 901 and 902 are turned on, thereby connecting output terminal 907 to $V_{SS}$ voltage supply terminal 908. Furthermore, both p-channel transistors 903 and 904 are turned off, thereby isolating output terminal 907 from $V_{CC}$ voltage supply terminal 909. A logic low output signal (i.e., $V_{SS}$) is therefore provided to output terminal 907 when both of the input signals have logic high voltage levels.

In the foregoing manner, PLC 900 implements a logical NAND function in accordance with known theory of CMOS logic gate construction when the floating gates 910a and 910b both store a neutral charge.

If floating gates 910a and 910b are programmed to store a negative charge, n-channel transistors 901 and 902 will be turned off, and p-channel transistors 903 and 904 will be turned on for any voltages applied to input terminals 905 and 906 (within a range of $V_{CC}$ to $V_{SS}$). As a result, a logic high voltage (i.e., $V_{CC}$) is provided to output terminal 907.

Furthermore, if floating gates 910a and 910b are programmed to store a positive charge, n-channel transistors 901 and 902 will be turned on and p-channel transistors 903 and 904 will be turned off for any voltages applied to input terminals 905 and 906 (within a range $V_{CC}$ to $V_{SS}$). As a result, a logic low voltage (i.e., $V_{SS}$) is provided to output terminal 907. In this manner, PLC 900 can be programmed to operate as a non-volatile memory cell.

The logic functionality of PLC 900 is shown below in Table 6.

TABLE 6

PLC 900 Truth Table

| Input Terminal 905 | Input Terminal 906 | Floating Gate 910a Charge state | Floating Gate 910b Charge state | Output Terminal 907 |
|---|---|---|---|---|
| High | High | 0 | 0 | Low |
| Low | High | 0 | 0 | High |
| High | Low | 0 | 0 | High |
| Low | Low | 0 | 0 | High |
| High | High | Neg. | 0 | High |
| Low | High | Neg. | 0 | High |
| High | Low | Neg. | 0 | High |
| Low | Low | Neg. | 0 | High |
| High | High | 0 | Neg. | High |
| Low | High | 0 | Neg. | High |
| High | Low | 0 | Neg. | High |
| Low | Low | 0 | Neg. | High |
| High | High | Neg. | Neg. | High |
| Low | High | Neg. | Neg. | High |
| High | Low | Neg. | Neg. | High |
| Low | Low | Neg. | Neg. | High |
| High | High | Pos. | 0 | Low |
| Low | High | Pos. | 0 | Low |
| High | Low | Pos. | 0 | High |
| Low | Low | Pos. | 0 | High |
| High | High | 0 | Pos. | Low |
| Low | High | 0 | Pos. | High |
| High | Low | 0 | Pos. | Low |
| Low | Low | 0 | Pos. | High |
| High | High | Pos. | Pos. | Low |
| Low | High | Pos. | Pos. | Low |
| High | Low | Pos. | Pos. | Low |
| Low | Low | Pos. | Pos. | Low |

The programming and erasing methods previously described in connection with PLC 400 can be applied to program and erase PLC 900 in the manner set forth in Table 7.

TABLE 7

F-N Programing and Erasing of PLC 900

| | $V_{SS}$ Terminal 908 (Source of 901) | Output Terminal 907 (Drain of 902, 904) | $V_{CC}$ Terminal 909 (Source of 903, 904) | Control Gate 905 | Control Gate 906 |
|---|---|---|---|---|---|
| Programming Float. Gate 910a | 0 V | 0 V or floating | 0–5 V | 15 V | 0 V |
| Programming Float. Gate 910b | 0 V | 0 V or floating | 0–5 V | 0 V | 15 V |
| Erase Float. Gate 910a (Negative Gate) | 0 V | 0 V or floating | 5 V | −10 V | 0–5 V |

TABLE 7-continued

F-N Programing and Erasing of PLC 900

| | $V_{SS}$ Terminal 908 (Source of 901) | Output Terminal 907 (Drain of 902, 904) | $V_{CC}$ Terminal 909 (Source of 903, 904) | Control Gate 905 | Control Gate 906 |
|---|---|---|---|---|---|
| Erase Float. Gate 910b (Negative Gate) | 0 V | 0 V or floating | 5 V | 0–5 V | –10 V |

F-N tunneling will occur in the p-channel transistors 903 and 904 between the respective floating gates 910a and 910b and the source and channel regions of transistors 903 and 904.

Programmable logic cells 400, 800 and 900 overcome several disadvantages of the prior art. First, PLCs 400, 800 and 900 are programmable to implement either a non-volatile memory cell or a logic element, using a relatively small number of transistors. Furthermore, PLCs 400, 800 and 900 require relatively small layout areas because the common floating gates do not extend substantially outside of the active regions of the transistors used to implement the PLCs. In addition, PLCs 400, 800 and 900 do not require separately fabricated capacitors in order to charge the common floating gate.

To summarize, PLCs in accordance with selected embodiments of the present invention implement up to three individual functions in one integrated sub-circuit:

1) a Non-Volatile storage cell;
2) a configurable cell that provides a logic signal on a corresponding output terminal; and
3) a logic gate.

Figure 1:
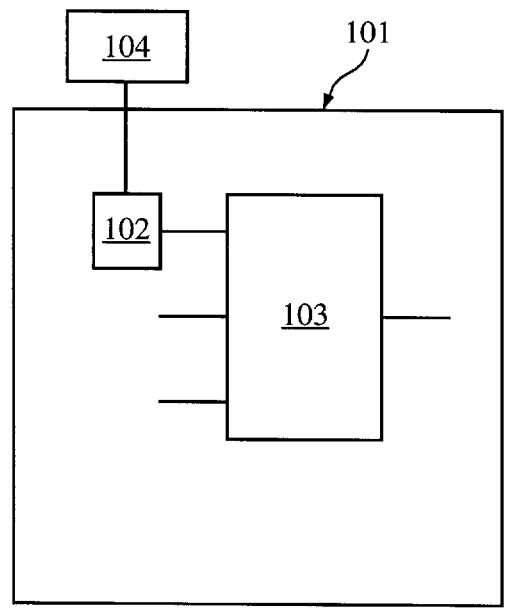
FIG. 1 is a block diagram of a conventional programmable logic device.
Figure 2:
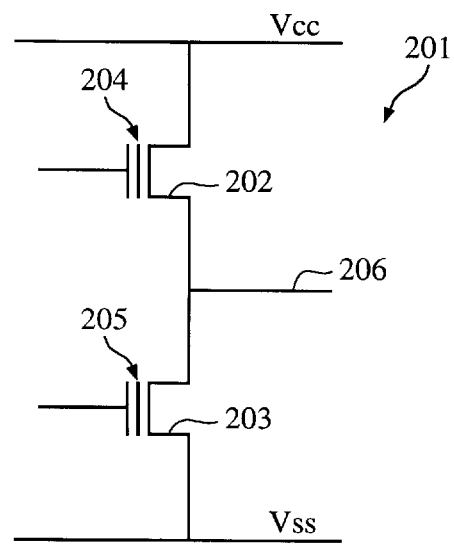
FIG. 2 is a block diagram of a conventional programmable memory cell which includes two EPROM memory cells.
Figure 3:
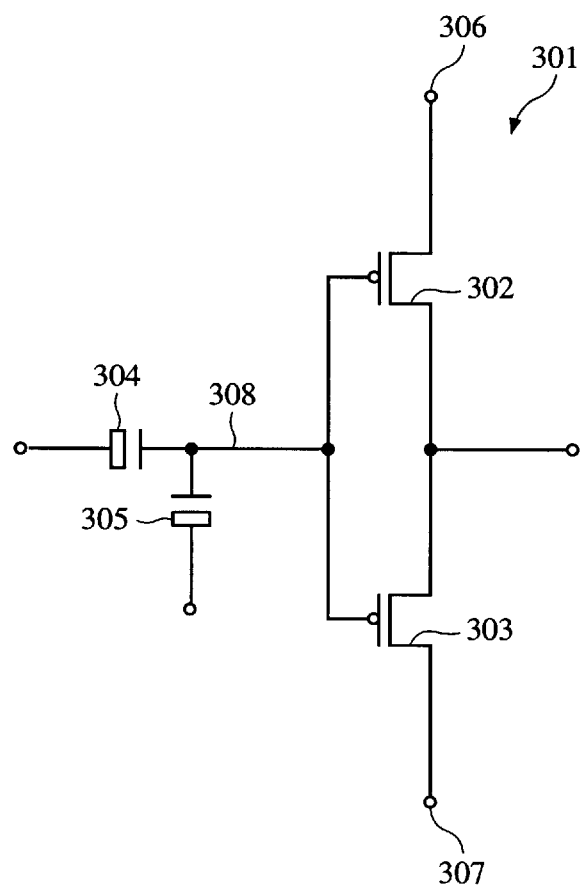
FIG. 3 is a block diagram of another conventional programmable memory cell which includes a control capacitor and a tunneling capacitor.

As a result, such PLCs perform the functionality of the following prior art elements of FIG. 1: non-volatile storage cell 104, on-chip SRAM storage cell 102, and some or all of the logic function of logic block 103. By integrating all of these functions into a single programmable logic cell, substantial saving in chip area can be achieved.

In embodiments where the PLC is used only as a non-volatile configurable cell, the PLC integrates the two following functions:

1) a Non-Volatile storage cell; and
2) a configurable cell that provides a logic signal on a corresponding output terminal.

In these embodiments, the PLC performs the functionality of the non-volatile storage cell 104 and on-chip SRAM storage cell 102 (FIG. 1). The integrated non-volatile storage cell combines these two functions in an area that is substantially smaller than the area needed to implement the SRAM storage cell 102 because SRAM cell 102 consists of 6 transistors, whereas PLC cell 400 only needs 2 transistors. As previously described, the area consumed by the capacitor formed by floating gate 407 and control gate 410 is located substantially over the field insulating layer 509. Because the field insulating layer 509 is required for isolating p-channel transistor 401 and n-channel transistor 402, the stacked configuration of floating gate 407 and control gate 410 results in no additional area requirements for the capacitor.

The principles of the present invention are not limited in scope to the described embodiment. For example, although the present invention has been described in connection with logic circuits which include an inverter (PLC 400), a NOR gate (PLC 800) and a NAND gate (PLC 900), it is understood that other logic circuits can be implemented by one of ordinary skill in the art. Moreover, although the described logic circuits have one or two input terminals, it is understood that logic circuits having more than two input terminals can be implemented by one of ordinary skill in the art (e.g., a three input NAND or NOR gate). It is also understood that the described inverter, NOR gate and NAND gate can be interconnected to implement other logic circuits in accordance with known CMOS logic techniques. Accordingly, other embodiments and variations not described herein may be considered within the scope of our invention as defined by one or more of the following claims.

What is claimed is:

1. A programmable logic cell comprising:
   a first voltage supply terminal for receiving a first supply voltage;
   a second voltage supply terminal for receiving a second supply voltage;
   an output terminal;
   a first transistor having a first conductivity type, the first transistor being coupled in series between the first voltage supply terminal and the output terminal;
   a second transistor having a second conductivity type opposite the first conductivity type, the second transistor being coupled in series between the second voltage supply terminal and the output terminal, wherein the first and second transistors share a common floating gate and a common control gate which extends over the common floating gate; and
   a programming circuit for controlling a charge on the common floating crate, wherein the programming circuit applies a control voltage other than the second supply voltage to the second voltage supply terminal to control the charge on the floating gate.

2. The programmable logic cell of claim 1, wherein the floating gate has substantially the same layout as the control gate.

3. The programmable logic cell of claim 1, further comprising:
   a field insulating layer having a first portion located between the first and second transistors, thereby providing isolation between the first and second transistors, wherein the floating gate and the control gate are located over the first portion of the field insulating layer.

4. The programmable logic cell of claim 1, wherein the programming circuit further controls the voltage of the common control gate to program charge in the floating gate and erase charge stored in the floating gate.

5. The programmable logic cell of claim 1, wherein the programmable logic cell operates as logic element when charge is erased from the floating gate, and wherein the programmable logic cell operates as a non-volatile memory cell when charge is programmed in the floating gate.

6. The programmable logic cell of claim 5, wherein the logic element is an inverter.

7. A programmable logic cell comprising:
   a first voltage supply terminal for receiving a first supply voltage;
   a second voltage supply terminal for receiving a second supply voltage;
   an output terminal;
   a first transistor having a first conductivity type, the first transistor being coupled in series between the first voltage supply terminal and the output terminal;

a second transistor having a second conductivity type opposite the first conductivity type, the second transistor being coupled in series between the second voltage supply terminal and the output terminal, wherein the first and second transistors share a common floating gate and a common control gate which extends over the common floating rate;

a third transistor having the first conductivity type, the third transistor being coupled in series with the first transistor between the first voltage supply terminal and the output terminal; and a fourth transistor having the second conductivity type, the fourth transistor being coupled in parallel with the second transistor between the second voltage supply terminal and the output terminal.

8. The programmable logic cell of claim 7, wherein the third transistor and the fourth transistor share a second common floating gate.

9. The programmable logic cell of claim 8, wherein the third transistor shares a second control gate with the fourth transistor, and the second control gate extends over the second floating gate.

10. The programmable logic cell of claim 7, wherein the third transistor shares a second control gate with the fourth transistor.

11. The programmable logic cell of claim 7, wherein the programmable logic cell is a NAND gate.

12. The programmable logic cell of claim 7, wherein the programmable logic cell is a NOR gate.

13. The programmable logic cell of claim 1, wherein the output terminal is coupled to a pass transistor of a programmable interconnect structure.

14. The programmable logic cell of claim 1, wherein the output terminal is coupled to a configurable logic block of a field programmable gate array.

15. A method of operating a programmable logic cell, the method comprising the steps of:

programming a floating gate of the programmable logic cell with charge of a first polarity type, thereby causing the programmable logic cell to enter a non-volatile first state, wherein the programmable logic cell provides an output signal having a first logic state when the programmable logic cell is in the first state;

programming the floating gate of the programmable logic cell with charge of a second polarity type, opposite the first polarity type, thereby causing the programmable logic cell to enter a non-volatile second state, wherein the programmable logic cell provides an output signal having a second logic state, opposite the first logic state, when the programmable logic cell is in the second state; and programming the floating gate of the programmable logic cell with a neutral charge, thereby causing the programmable logic cell to enter a third state, wherein the programmable logic cell provides an output signal representative of a predetermined logic function in response to one or more input signals when the programmable logic cell is in the third state.

16. The method of claim 15, wherein the predetermined logic function is an inverter function.

17. The method of claim 15, wherein the predetermined logic function is a logical NAND function.

18. The method of claim 15, wherein the predetermined logic function is a logical NOR function.

19. A programmable logic cell comprising:

a first voltage supply terminal for receiving a first supply voltage;

a second voltage supply terminal for receiving a second supply voltage;

an output terminal;

a first transistor having a first conductivity type, the first transistor being coupled in series between the first voltage supply terminal and the output terminal;

a second transistor having a second conductivity type opposite the first conductivity type, the second transistor being coupled in series between the second voltage supply terminal and the output terminal, wherein the first and second transistors share a common floating gate and a common control gate which extends over the common floating gate; and a programming circuit for controlling charge on the common floating gate, wherein the programming circuit provides a predetermined voltage on the output terminal to set a desired charge on the floating gate.

20. The programmable logic cell of claim 19, wherein the programming circuit further controls the voltage of the common control gate to program charge in the floating gate and erase charge stored in the floating gate.

* * * * *